US008634963B2

(12) United States Patent
Tozer et al.

(10) Patent No.: US 8,634,963 B2
(45) Date of Patent: Jan. 21, 2014

(54) DATA CENTRE AND APPARATUS AND METHOD FOR DATA CENTRE COOLING

(75) Inventors: Robert Tozer, Kingston upon Thames (GB); Luke Neville, Colchester (GB)

(73) Assignee: Hewlett-Packard Development Company, L.P., Houston, TX (US)

( * ) Notice: Subject to any disclaimer, the term of this patent is extended or adjusted under 35 U.S.C. 154(b) by 238 days.

(21) Appl. No.: 13/132,866

(22) PCT Filed: Nov. 13, 2009

(86) PCT No.: PCT/EP2009/065171
§ 371 (c)(1),
(2), (4) Date: Jun. 3, 2011

(87) PCT Pub. No.: WO2010/063559
PCT Pub. Date: Jun. 10, 2010

(65) Prior Publication Data
US 2011/0238236 A1    Sep. 29, 2011

(30) Foreign Application Priority Data

Dec. 5, 2008  (GB) .................................. 0822213.5

(51) Int. Cl.
*G05B 13/00* (2006.01)
*G05B 15/00* (2006.01)
*G05D 23/00* (2006.01)
*H05K 7/20* (2006.01)

(52) U.S. Cl.
USPC ............................. 700/278; 700/300; 361/694

(58) Field of Classification Search
USPC .................. 700/275–278, 299, 300; 361/600, 361/679.01, 688–691, 694–696; 236/49.1, 236/49.4
See application file for complete search history.

(56) References Cited

U.S. PATENT DOCUMENTS

| 7,214,131 | B2* | 5/2007 | Malone ......................... 454/184 |
| 7,430,118 | B1* | 9/2008 | Noteboom et al. ........... 361/695 |
| 7,542,287 | B2* | 6/2009 | Lewis et al. ................... 361/695 |
| 7,885,795 | B2* | 2/2011 | Rasmussen et al. .............. 703/5 |
| 7,979,250 | B2* | 7/2011 | Archibald et al. ................ 703/5 |
| 8,180,494 | B2* | 5/2012 | Dawson et al. ............... 700/278 |
| 8,346,398 | B2* | 1/2013 | Ahmed et al. ................ 700/278 |
| 8,432,690 | B2* | 4/2013 | Fink et al. ..................... 361/695 |
| 2005/0075065 | A1 | 4/2005 | Nair |
| 2006/0168975 | A1 | 8/2006 | Malone et al. |

(Continued)

FOREIGN PATENT DOCUMENTS

WO    03083631 A1    10/2003

OTHER PUBLICATIONS

International Search Report and Written Opinion for PCT Application No. PCT/EP2009/065171. European Patent Office. Feb. 19, 2010.

*Primary Examiner* — Crystal J Barnes-Bullock

(57) ABSTRACT

According to one embodiment of the present invention, there is provided an apparatus for cooling a data center. The apparatus comprises an air conditioning unit for supplying cooled air to a cold portion of a data center, an airflow measurement device for measuring a rate of bypass airflow through a segregation between the cold portion and hot portion of the data center, and outputting a bypass airflow signal indicative of the rate of bypass airflow between the cold portion and the hot portion, and a control unit arranged to receive the bypass airflow signal from the airflow measurement device and to output a control signal to a means for controlling a rate of the bypass airflow to maintain a predetermined rate of bypass airflow.

15 Claims, 13 Drawing Sheets

(56) References Cited

U.S. PATENT DOCUMENTS

| | | |
|---|---|---|
| 2006/0199508 A1 | 9/2006 | Nair et al. |
| 2006/0217055 A1 | 9/2006 | Kupferberg et al. |
| 2006/0225446 A1 | 10/2006 | Bash et al. |
| 2008/0185446 A1* | 8/2008 | Tozer .......................... 236/49.4 |
| 2008/0198549 A1* | 8/2008 | Rasmussen et al. .......... 361/696 |
| 2013/0188310 A1* | 7/2013 | Noteboom et al. ...... 361/679.48 |

* cited by examiner

DATA CENTRE AND APPARATUS AND METHOD FOR DATA CENTRE COOLING

CLAIM FOR PRIORITY

The present application is a national stage filing under 35 U.S.C 371 of PCT application number PCT/EP2009/065171, having an international filing date of Nov. 13, 2009, which claims priority to GB Patent Application Number 0822213.5, filed on Dec. 5, 2008, which is incorporated by reference in its entirety.

BACKGROUND

Data centres are environments in which computing equipment is located. Typically, a data centre houses a plurality of computers arranged in fixtures, such as cabinets or racks. Each computer may include a combination of components, such as one or more processors and associated memory devices, storage devices such as magnetic or optical based storage devices, and one or more communication devices.

Due to the concentration of computing equipment in a data centre, cooling is required in order to maintain a temperature within the data centre to an acceptable level. Typically, one or more computer-room air conditioning (CRAC) units are arranged to receive warm air from, and supply cooled air to, the data centre. Each CRAC unit comprises one or more fans to draw data centre air into the CRAC unit. The in-drawn air is cooled as it passes through the CRAC unit, for example by exposure to a heat exchanger comprising chilled water, and expelled into a cold area of the data centre to cool the computing equipment. Each item of computing equipment generally comprises a fan to draw air therethrough to cool electronic components and/or devices within the computing equipment. Air is expelled from the computing equipment into a hot area of the data centre for return to the one or more CRAC units.

FIG. 1 illustrates air pressure against airflow within a data centre having 1, 2 or 3 operational CRAC units and between one and twenty four items of computing equipment each having an internal fan. Airflow and pressure for a single CRAC unit is represented by line 101; line 102 represents airflow and pressure for two CRAC units operating in parallel; and line 103 represents three CRAC units operating in parallel. Airflow and pressure for one item of the computing equipment is represented by line 104, whilst pressure and airflow for twenty four items of computing equipment arranged in parallel is shown by line 105. Airflow through intermediate numbers of items of computing equipment is shown in FIG. 1, although each line is not individually labelled for clarity. It will be noted that twenty four items of computing equipment are described for example only and the data centre may comprise further items of computing equipment.

An operational variance 106 in controlling airflow through each CRAC units exists. The variance in controlling the airflow through three CRAC units is shown in FIG. 1(a) and the effect 107 of the CRAC unit operating variance on the twenty four items of computing equipment is shown in FIG. 1(b) which represents a close-up of the same part in FIG. 1(a). Due to the relatively high operational air pressure of the CRAC units compared to the lower operating pressure of each item of computing equipment, a relatively small variation in CRAC unit air pressure has a relatively large effect on the cooling system and cooling of the computing equipment. This is troublesome for the computing equipment, particularly since many complex items of computing equipments, such as servers and the like, include a plurality of temperature sensors and complex cooling control systems which are greatly affected by the variation in CRAC unit airflow output.

It is an object of embodiments of the invention to at least mitigate one or more of the problems of the prior art.

BRIEF DESCRIPTION OF THE DRAWINGS

Embodiments of the invention will now be described by way of example only, with reference to the accompanying figures, in which.

DETAILED DESCRIPTION OF EMBODIMENTS OF THE INVENTION

In order to better understand embodiments of the present invention, airflow in a prior art un-segregated data centre 200 will first be described with reference to FIG. 2. By un-segregated it is understood the data centre 200 is formed by a unitary volume in which computing equipment is located and is supplied with cooled air from one or more CRAC units.

The data centre 200 comprises a CRAC unit 201, which is arranged to supply cooled air 210 to the data centre 200, and computing equipment 202 which is cooled by air within the data centre 200 being drawn into a housing of the computing equipment and expelled back into the data centre 200.

Figure 1A:
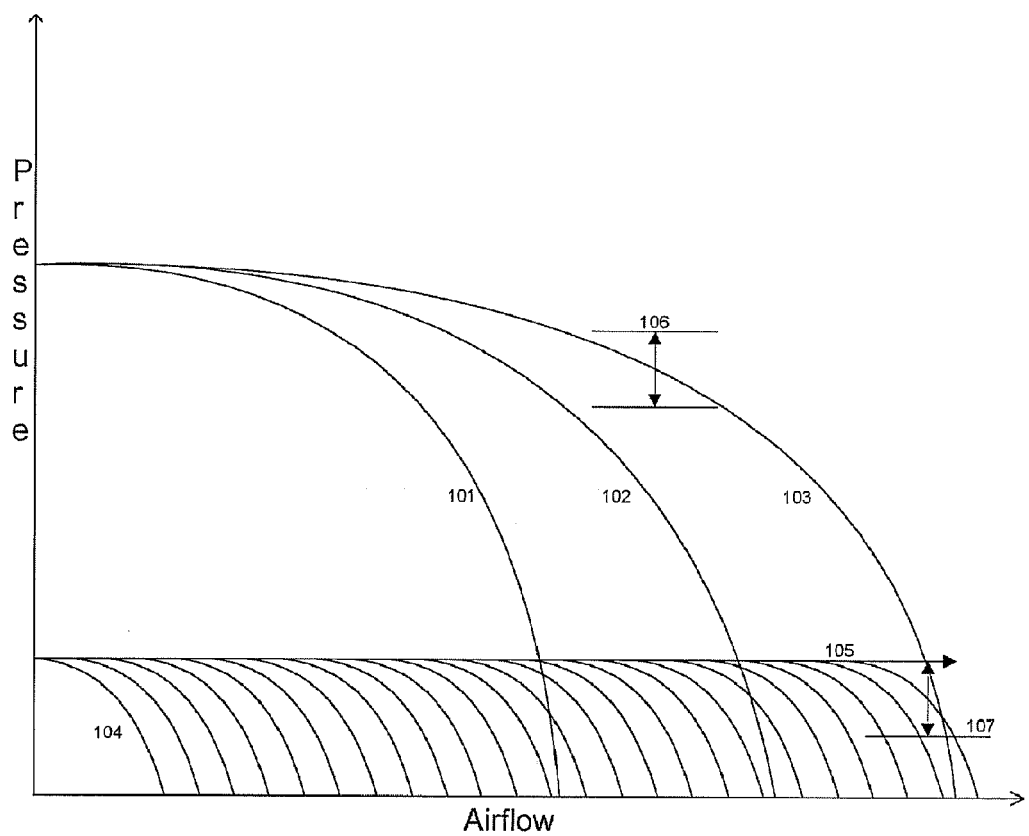
FIG. 1 shows an illustration of pressure against airflow for a number of different CRACs and items of computing equipment.
Figure 1B:
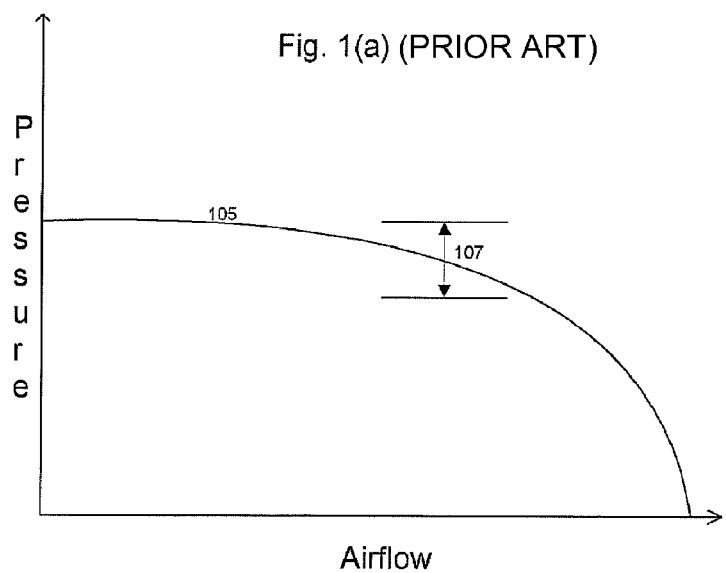
Figure 2:
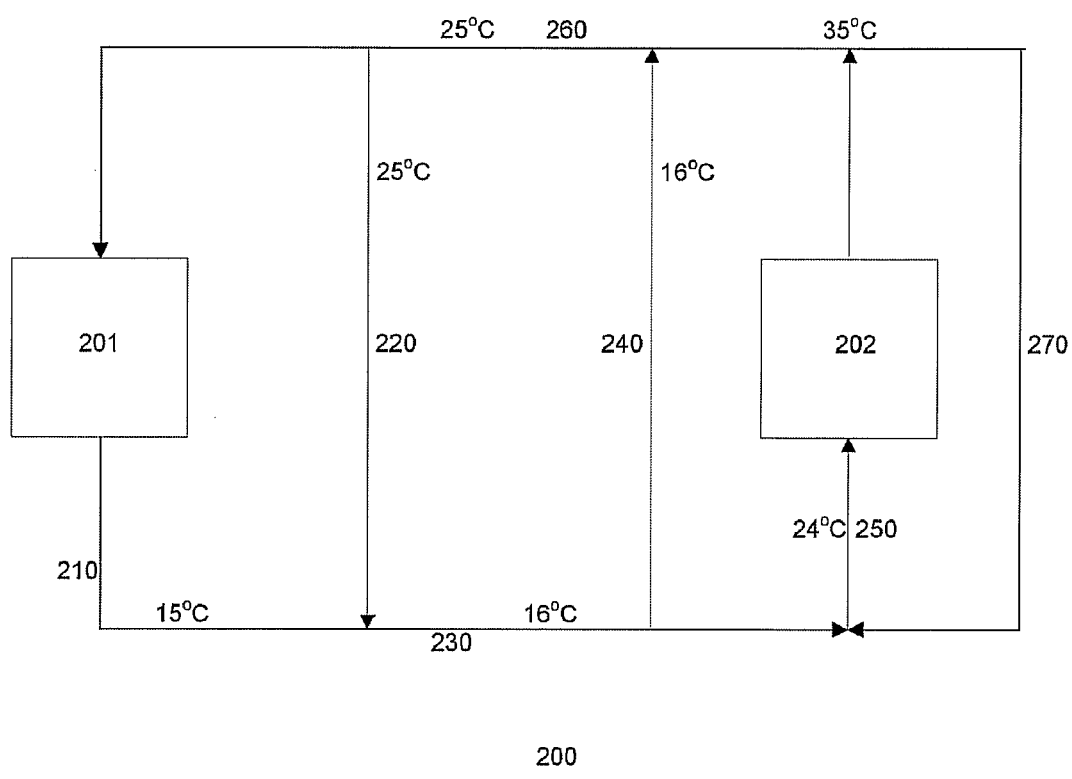
FIG. 2 shows a schematic illustration of airflows in un-segregated cold and hot air streams in a data centre.

Various airflows are indicated in FIG. 2 and these will now be described along with example temperatures to illustrate the movement of air within the data centre 200. The CRAC unit 201 supplies cooled air to the data centre 200 at an example temperature of 15° C. The supplied air 210 may mix with a negative pressure airflow 220. The negative pressure airflow 220 is caused when a negative pressure region exists near a CRAC unit discharge where a velocity of the discharged air is high and the velocity-pressure exceeds a total air pressure in the data centre, thus resulting in the negative pressure region. Such a negative pressure region may exist around floor grilles, floor openings, etc. It will be noted that not all data centres include a negative pressure region. The negative pressure airflow is only created when the negative pressure exists around a CRAC airflow discharge and known design techniques attempt to reduce negative pressures existing in these regions. In the illustrated example, the negative pressure airflow 220 is at an example temperature of 25° C. and serves to raise the temperature of the resultant combined airflow 230 to 16° C.

A bypass airflow 240 is present in the proximity of the computing equipment 202. The bypass airflow 240 is cooled air from output from the CRAC unit, mixed with any negative pressure airflow 220, which bypasses the computing equipment 202 and generally returns to the CRAC unit 201 without having provided cooling to the computing equipment 202.

Following a loss of some cool air to the bypass airflow 240, the remaining air 250 passes through the computing equipment 202 and is heated by the computing equipment 202 to an example temperature of 35° C. The expelled air from the computing equipment mixes with the bypass airflow 240 to form a resulting airflow 260 having an example temperature of 25° C. which is returned to the CRAC 201 unit for cooling.

If the computing equipment 202 draws in more air than supplied by the airflow 250, a recirculation airflow 270 is formed. The recirculation airflow 270 is warmed air from the computing equipment 202 which recirculates to re-enter the computing equipment 202. In the example, the recirculation airflow 270 is at a temperature of 35° C. The resultant combined airflow 250 into the computing equipment 202 is at an example temperature of 24° C., depending on the ratio of recirculated airflow 270 to supply airflow 230

An embodiment of the present invention will now be described with reference to FIG. 3 which schematically shows a data centre 300.

In embodiments of the present invention, segregation between cold and hot air areas is used to control airflow there-between. Segregation between cold and hot air areas is achieved through appropriate construction of air-tight barriers, such as walls, doors, computing cabinets etc. In particular, in embodiments of the present invention, the recirculation airflow is prevented, or at least substantially minimised, by the segregation. A negative pressure airflow may exist in the data centre 200. However, known design techniques may be used to minimise the negative pressure airflow and therefore it will not be further discussed. In embodiments of the present invention, a predetermined level of bypass airflow is maintained in the data centre. In embodiments of the present invention, the bypass airflow is measured and the output airflow of the one or more CRAC units is controlled in response to the measured bypass airflow, such that the bypass airflow is maintained at the predetermined level. In some embodiments of the inventions, the predetermined level is a minimum level of bypass airflow, at or close to which the bypass airflow is maintained. However, in other embodiments of the invention, the bypass airflow is maintained within a predetermined range.

Advantageously, by maintaining a generally constant but relatively small level of bypass airflow, a small positive pressure is maintained at an air inlet to computing equipment, regardless of an operating load of the computing equipment. In this way, air supplied to the computing equipment is the same as that leaving one or more CRAC units supplying that air i.e. recirculation of air is minimised or eliminated, and only a necessary amount of air for cooling the computing equipment and maintaining the small level of bypass airflow is supplied. Furthermore, problems associated with CRAC unit fans and computing equipments fans in series are reduced.

Embodiments of the present invention will be described with reference to cold and hot portions of the data centre. It is understood that the cold portion is segregated from the hot portion and contains comparatively cool air supplied from one or more air conditioning units, whilst the hot portion contains warm air expelled from the computing equipment.

Figure 3:
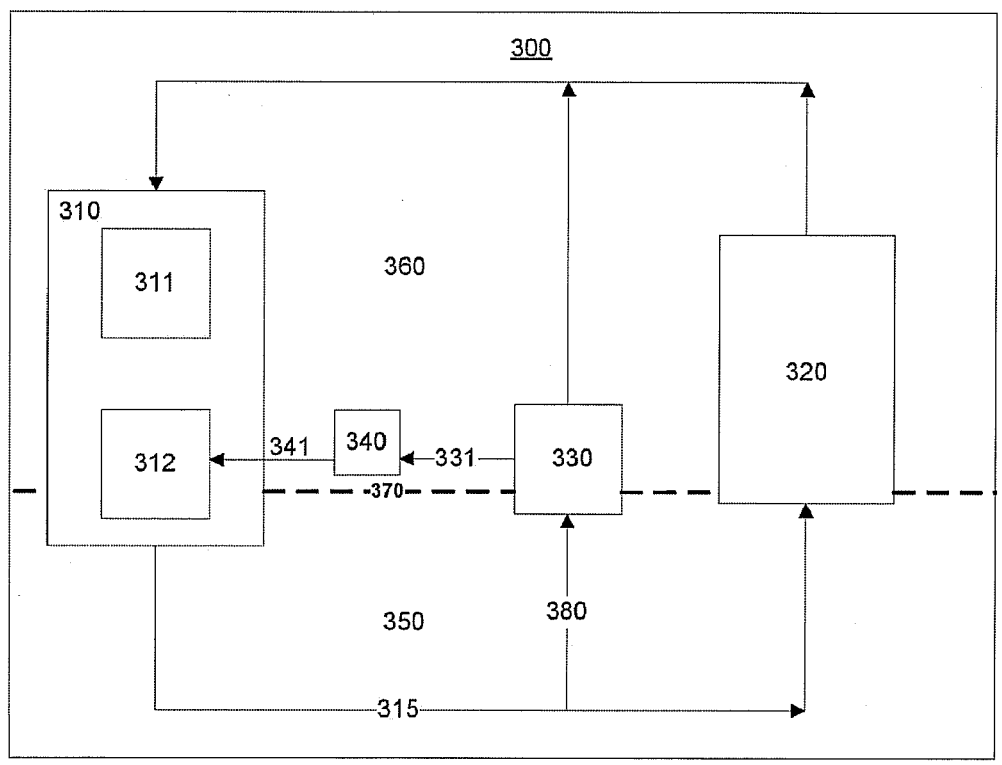
FIG. 3 shows a schematic illustration of a data centre according to an embodiment of the invention.

Referring to FIG. 3, the data centre 300 comprises a CRAC unit 310, computing equipment 320, a flow meter 330 and a control unit 340.

The CRAC unit 310 includes a cooling unit 311 which is arranged to cool air being moved through the CRAC unit by a fan 312. The cooling unit 311 may be a heat exchanger having a cooled liquid, such as water, passing through one channel thereof whilst the air passes through another channel, such that heat is absorbed by the liquid from the air to thereby output a cooled airflow 315 from the CRAC unit 310. The cooled air 315 emitted from the CRAC unit 310 is expelled into a cold portion 350 of the data centre 300. The cold portion 350 is segregated from a hot portion 360 of the data centre 300 by a barrier 370. Air is drawn through the computing equipment 320 from the cold portion 350 by one or more fans (not shown) within a housing of the computing equipment 320. Air heated by the computing equipment 320 is expelled from the computing equipment 320 into the hot portion 360 of the data centre 300.

The flow meter 330 is located in an aperture of the barrier 370 segregating the cold and hot portions 350, 360 of the data centre 300. The flow meter 330 is located in a decoupling area of the data centre 300. The decoupling area is a common area in the data centre 300 between fans present within the computing equipment 320 and the CRAC unit 310. Ideally, the decoupling area is as large as practically possible to achieve effective decoupling of airflows. However, in practical embodiments, the decoupling area has a limited size to achieve sufficient decoupling. A bypass airflow 380 from the cold portion 350 to the hot portion 360 is allowed to flow through the flow meter 330, such that the flow meter 330 measures a velocity of the bypass airflow 380. A bypass airflow signal 331 indicative of the measured velocity is output by the flow meter 330 to the control unit 340. Although it will be realised that any device capable of measuring airflow rate may be used, in some embodiments the flow meter 330 is a flow grid which forms the aperture through the segregation between the cold and hot portions. That is, the bypass airflow between the cold and hot portions flows through the flow grid. The flow grid is formed by a parallel set of tubes connected by manifolds. The tubes are perforated and provide a single differential pressure signal 331 which is proportional to the square of air flow velocity through the flow grid. The flow grid is a multi-point averaging device which determines a flow rate by measuring an average pressure drop across the flow grid. In some embodiments, the flow grid may be a Wilson flow grid. In an alternative embodiment, a rotary flow meter may used to measure the bypass airflow rate.

The bypass airflow signal 331 is provided to the control unit 340, which controls an airflow rate of the CRAC unit 310 in response to the bypass airflow signal 331. In the described embodiment, the control unit 340 is arranged to output a CRAC unit control signal 341 to control a speed of the fan 312 to maintain the bypass airflow 380 at a predetermined level. That is, the speed of the fan 312 is adjusted according to the velocity of the bypass airflow 380 through the flow meter 330. The speed of the fan 312 may be controlled such that the bypass airflow 380 is maintained to, for example, between 1 and 5% of the total CRAC unit 310 output airflow 315. Advantageously, when the speed of the fan 312 is reduced, less energy will be consumed by the CRAC unit. In an alternative embodiment, the control signal 341 is provided to a mechanical actuator arranged to control a cross-sectional area of the aperture in the segregation between the cold and hot portions, such that the bypass airflow rate may be controlled in response to the control signal 341 by increasing or decreasing the cross sectional area of the aperture.

Whilst the control unit 340 has been described in conjunction with FIG. 3 as a separate entity, in other embodiments the control unit 340 may form part of the CRAC unit 310. In these embodiments the CRAC unit 310, and the control unit 340 located therein, is arranged to receive the bypass airflow signal 331 and the output of the CRAC unit 310 is controlled in response thereto. Furthermore, whilst the control signal 341 is shown as controlling a single CRAC unit 310, a plurality of CRAC units may be controlled by the control signal 341.

Advantageously, the inefficient recirculation airflow is prevented, or at least minimised, by the segregation 370 of the cold and hot portions 350, 360 of the data centre 300 and the airflow output from the CRAC unit 310 which passes through the computing equipment 320 is managed by determination of the bypass airflow 380 and control of the CRAC unit 310 output in response thereto by the control unit 340.

A further embodiment of the present invention will now be described with reference to FIG. 4. The embodiment shown in FIG. 4 may be referred to as a cold air containment data centre in which cold air is contained, whilst a majority of the data centre is filled with hot air.

Figure 4A:
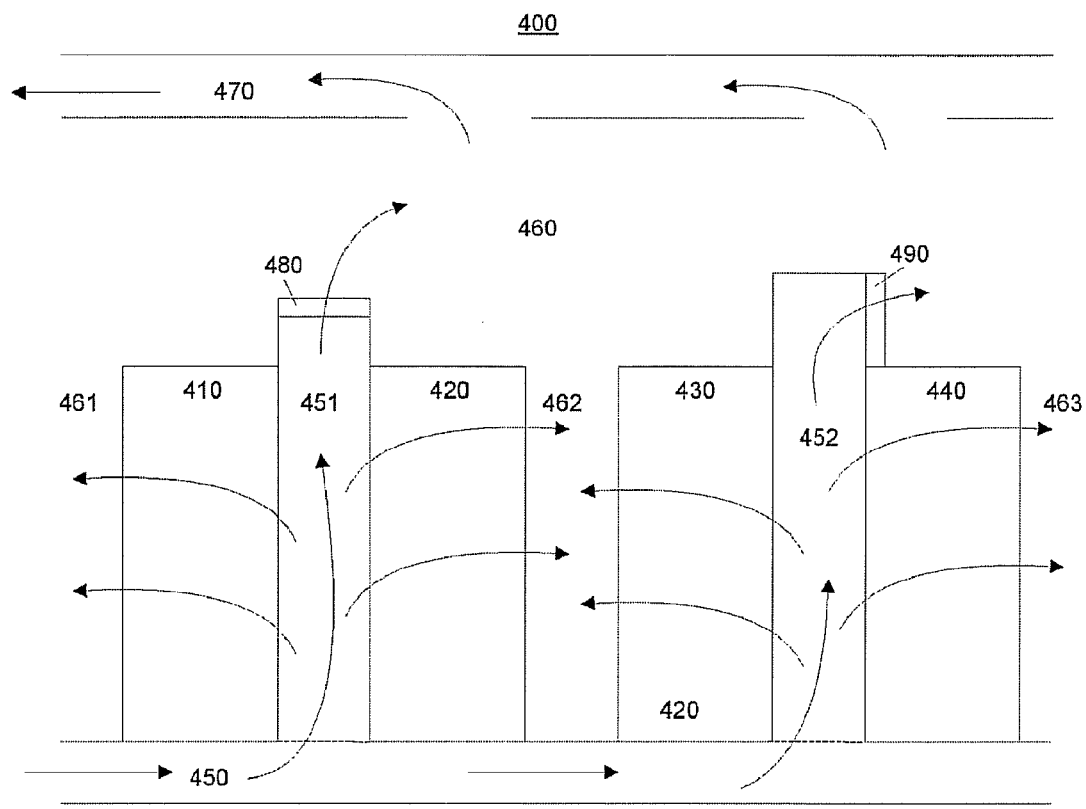
FIG. 4 shows a cross section and plan view of a data centre according to another embodiment of the invention.
Figure 4B:
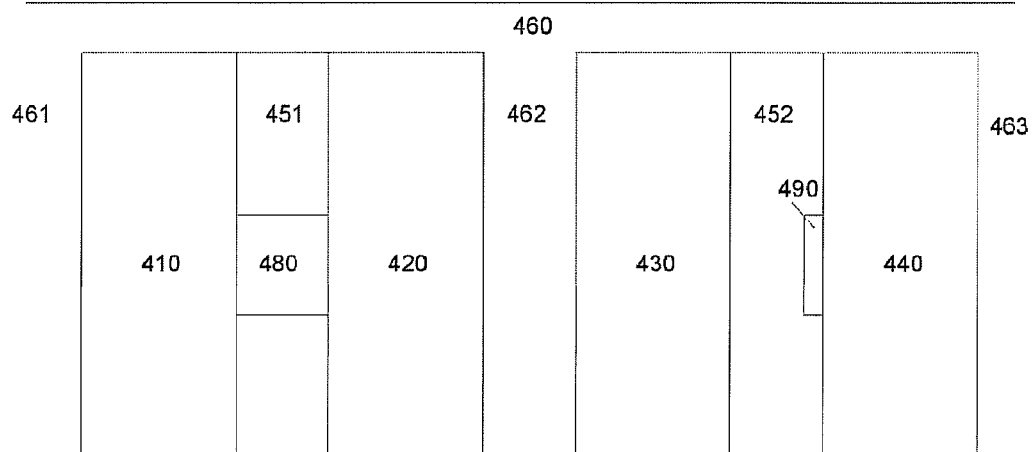

FIG. 4(a) shows a vertical cross section through a data centre 400 which includes under-floor and over-head ducting or plenums, as will be described. FIG. 4(b) shows a plan view of the data centre 400 taken from above computing cabinets present within the data centre 400.

The data centre 400 includes a plurality of racks or cabinets 410, 420, 430, 440 housing computing equipment. In the case that the computing equipment is mounted in racks then blanking plates and/or brushes are used appropriately to segregate cold and hot portions of the data centre 400. In the described embodiment, computing equipment is mounted in four cabinets 410, 420, 430, 440, such that the data centre 400 is divided in an alternating manner into cold 451, 452 and hot 461, 462, 463 aisles. It will be realised that other numbers of cabinets 410, 420, 430, 440 may be included in the data centre 400.

Cool air output by one or more CRAC units (not shown) is supplied through an under-floor cold air plenum, or duct, 450 to first and second cold aisles 451, 452. The cold aisles 451, 452 are formed by segregation at each end of the computing cabinets 410, 420, 430, 440 including walls and/or doors. A majority of the air entering the cold aisles 451, 452 is drawn through the computing equipment cabinets 410, 420, 430, 440 to cool the computing equipment mounted therein. Fans present within the computing equipment in the cabinets 410, 420, 430, 440 draw air from the cold aisles 451, 452 through inlets in a front of each cabinet 410, 420, 430, 440 and through the computing equipment housing to cool internal components and devices. Air is expelled from the cabinets 410, 420, 430, 440 through outlets in a rear of each cabinet into the hot aisles 461, 462, 463 which form part of a hot portion 460 of the data centre 400. The hot portion 460 of the data centre 400 is present above and around the cabinets 410, 420, 430, 440 as shown in FIGS. 4(a) and (b). A flow grid 480, 490 is arranged in an aperture present in the segregation between each cold aisle 451, 452 and the hot portion 460 of the data centre 400 to allow a bypass airflow there-through. As discussed previously, the bypass airflow is cold air which enters the hot portion 460 from the cold portion 450 without having cooled computing equipment.

FIG. 4(a) shows two different arrangements of flow grid. In the left-hand cool aisle 451 the flow grid 480 is arranged generally horizontally in a ceiling of the cold aisle 451 segregation, whereas in a right-hand cold aisle 452 the flow meter 490 is arranged generally vertically in a segregating wall extending upward from the cabinet 490. Air is returned to the CRAC unit(s) from the air portion 460 for cooling along a return air plenum 470 located over the hot portion 460. Air enters the return air plenum 470 through a plurality of apertures.

In the data centre 400 shown in FIG. 4, a single air supply from one or more CRAC units is provided to the plurality of cold aisles 451, 452 and each of the flow grids 480, 490 outputs a bypass airflow signal. A control unit, as described above although not shown in FIG. 4, is arranged to receive the plurality of bypass airflow signals output by the flow grids 480, 490 and to detect when one or more of the measured bypass airflows drops below the predetermined bypass flow level. In response, the control unit is arranged to control the one or more CRAC units to increase an airflow rate of cooled air to the plurality of cold aisles 451, 452. Alternatively, each cold aisle 451, 452 may be supplied with cooled air by a dedicated CRAC unit by division of the cold portion 450, such that each cold aisle receives cooled air from the respective CRAC unit. In this arrangement, the flow grid for each cold aisle 451, 452 is arranged to output the bypass airflow signal to the control unit to control airflow into the cold aisle according to the bypass airflow there-from. Either of these arrangements may be applied to the embodiments of data centres described herein.

Figure 5A:
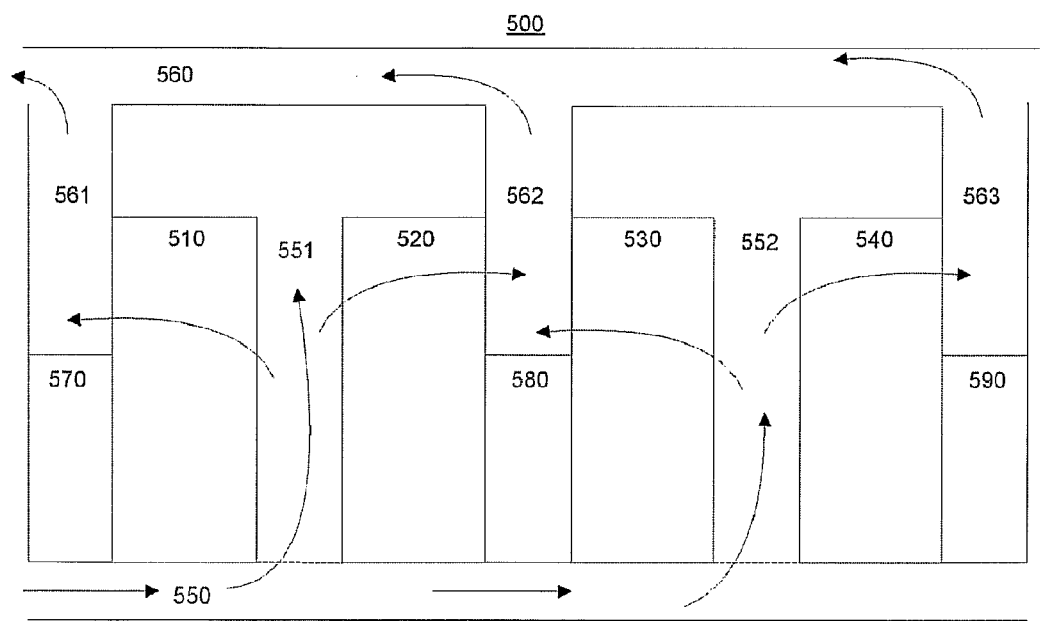
FIG. 5 shows a cross section and plan view of a data centre according to a further embodiment of the invention.
Figure 5B:
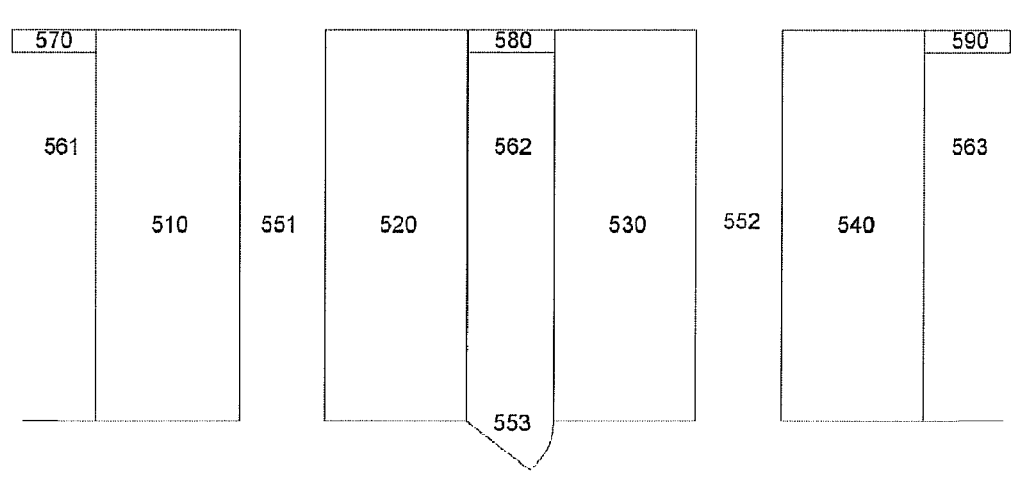

A further embodiment of the present invention will now be described with reference to FIG. 5. FIG. 5(a) shows a cross section view through a data centre 500 and FIG. 5(b) shows a plan view, as in FIG. 4. The data centre 500 shown in FIG. 5 may be referred to as a hot air containment data centre in which hot air expelled from computing equipment is contained, whilst a majority of the data centre contains cold air.

As in FIG. 4, computing equipment is arranged in four computing cabinets 510, 520, 530, 540 and cooled air from one or more CRAC units (not shown) is supplied via a cold plenum 550 to enter cold aisles 551, 552 between pairs of computing cabinets 510, 520 and 530, 540. Air is drawn in a front of each computing cabinet 510, 520, 530, 540 by fans present within computing equipment housed within the computing cabinets 510, 520, 530, 540 and is expelled through a rear of each cabinet into a plurality of hot aisles 561, 562, 563. However, in contrast to the embodiment shown in FIG. 4, the hot aisles 561, 562, 563 in FIG. 5 are contained by vertically extending segregation between and upward of pairs of cabinets 510, 520 and 530, 540. An end of each hot aisle 561, 562, 563 between pairs of computing cabinets 510, 520, 530, 540 is enclosed by a wall, door or combination thereof. FIG. 5(b) shows an end of one hot aisle 562 having a door 553 which allows access to the hot aisle 562. The hot aisle segregation extends upward to direct hot air toward apertures in a hot plenum 560 to return air to the one or more CRAC units. Each hot aisle 561, 562, 563 comprises a flow grid 570, 580, 590 arranged in an aperture of the segregation between the cold and hot portions 450, 460 of the data centre 500. The flow grid 570, 580, 590 may be arranged in a wall forming the segregation, to form a door, or a part thereof, of the hot aisle, or any other suitable location such that the bypass airflow between the cold portion 450 and the hot portion 460 may be measured and a bypass airflow signal output in response thereto to control one or more CRAC units as described above.

Figure 6A:
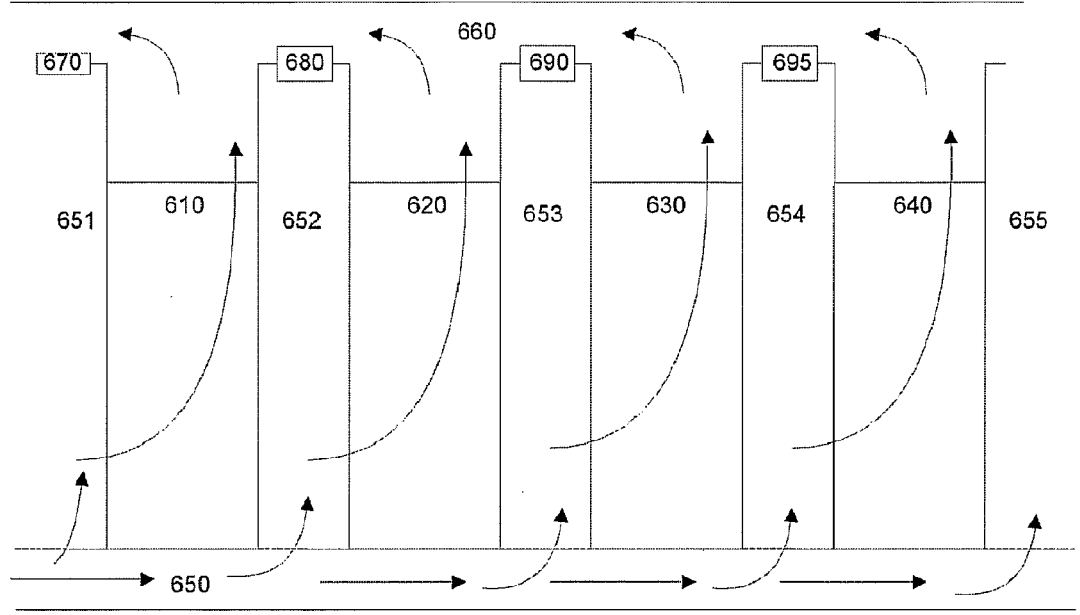
FIG. 6 shows a cross section and plan view of a data centre according to a still further embodiment of the invention.

FIG. 6 shows a further embodiment of data centre 600 according to an embodiment of the present invention. FIG.

Figure 6B:
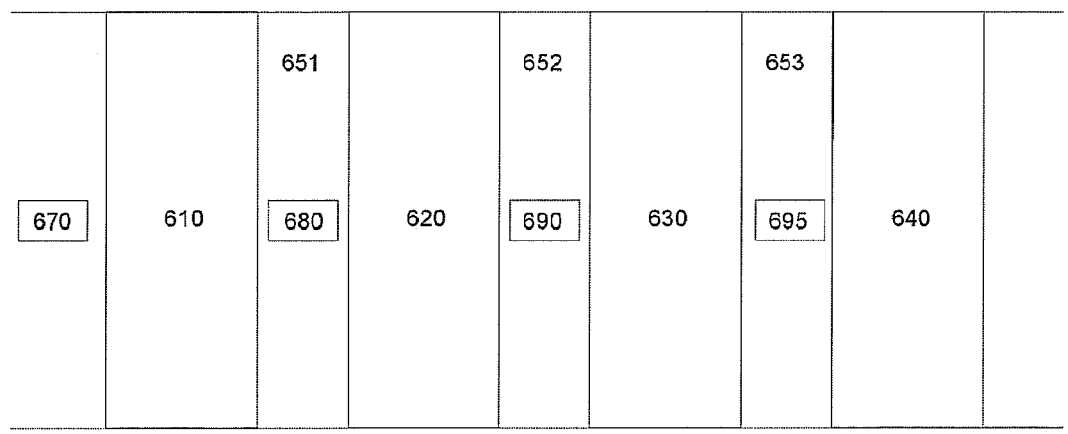

6(a) shows a cross section view through a data centre 600 and FIG. 6(b) shows a plan view, as in FIGS. 4 and 5. The data centre 600 shown in FIG. 6 may be referred to as a cabinet exhaust containment data centre, since an exhaust of each computing cabinet is contained and directed to return hot air to a ceiling return plenum or duct.

Referring to FIG. 6, the data centre comprises four computing cabinets 610, 620, 630, 640 in which computing equipment is housed. A cold plenum 650 supplies cooled air from one or more CRAC units (not shown) which is fed into cold aisles 651, 652, 653, 654, 655 between the computing cabinets 610, 620, 630, 640. Air is drawn into the cabinets 610, 620, 630, 640 from the cold aisle through inlets by fans operating in the computing equipment. Hot air is then exhausted directly into a hot air return plenum 660 via upwardly extending exhaust containment. Each cold aisle 651, 652, 653, 654, 655 comprises a flow grid 670, 680, 690, 695 arranged in an aperture of the segregation between that cold aisle and the hot plenum 660 to allow a bypass airflow there-between which is measured by the respective flow grid 670, 680, 690, 695. In the embodiment shown in FIG. 6, the flow grids 670, 680, 690, 695 are arranged to allow the bypass airflow to directly enter the hot plenum 660 from the cold aisles 651, 652, 653, 654, 655.

Embodiments of the present invention will now be described with reference to the following figures which incorporate CRAC unit redundancy, whereby data centre cooling may be adequately achieved even when one or more CRAC units have limited operation, such as being inoperable. In these embodiments, bypass airflow in an area, for example a cold aisle, is measured by a plurality of flow grids which are each arranged to output a respective bypass airflow signal. A plurality of bypass airflow signals are received by a control unit which is arranged to control one or more CRAC units. In the event that a CRAC unit has reduced operation, the flow grids outputting bypass airflow signals to control other CRAC units measure a reduced level of bypass airflow. In response, the other CRAC units increase airflow to compensate for the CRAC unit having the reduced operation.

Referring to FIG. 7, a data centre 700 comprises a plurality of aisles between rows or computing cabinets. In the described embodiment shown in FIG. 7(a), the data centre 700 has a hot air containment arrangement, similar to that previously described with reference to FIG. 5. The data centre 700 comprises six rows of cabinets 711, 712, 713, 714, 715, 716 housing computer equipment, although it will be realised that the number of cabinets is merely for illustrative purposes. Interposing the rows of cabinets 711, 712, 713, 714, 715, 716 are alternating hot 761, 762, 763 and cold 751, 752, 753, 754 aisles. A first hot aisle 761 is located between the first and second rows of cabinets 711, 712; a second hot aisle 762 is located between the third and fourth rows of cabinets 713, 714; and a third hot aisle 763 is located between the fifth and sixth rows of cabinets 715, 716. The hot aisles 761, 762, 763 form a hot area of the data centre 700. A cold area 750 surrounds the cabinets 711, 712, 713, 714, 715, 716 and hot aisles 761, 762, 763. The cold area 750 includes the four cold aisles 751, 752, 753, 754 and further comprises under-floor ducting (not shown) through which cooled air is supplied to the cold aisles 751, 752, 753, 754 which interpose each pair of cabinets surrounding the hot aisles 761, 762, 763. Three CRAC units 721, 722, 723 are each arranged to receive hot air from the hot area of the data centre 700. It will be noted that the location of the CRAC units 721, 722, 723 in FIG. 7(a) is merely for illustrative purposes and the CRAC units may be located internal or external to the data centre 700. Cool air is returned by the CRAC units 721, 722, 723 to the cold portion 750 and is then drawn in to the cabinets 711, 712, 713, 714, 715, 716 to cool computing equipment housed therein, before being expelled to a corresponding hot aisle 761, 762, 763.

Each hot aisle 761, 762, 763 comprises an aperture having a flow grid 731, 732, 733 arranged therein for allowing a bypass airflow to enter the hot aisle 761, 762, 763 from the cold area 750, including the cold aisles 751, 752, 753, 754. In previously described embodiments, each flow grid was arranged to provide a single bypass airflow signal indicative of the bypass airflow through the flow grid. This is shown in a left-hand column of FIG. 7(b), wherein, for example, the first warm air aisle 761 comprises the first flow grid 731 which provides a bypass airflow signal to control the first CRAC unit 721. Similarly, the second and third warm air aisles 762, 763 comprise the second and third flow grids 732, 733 which are arranged to measure the bypass airflow into each warm air aisle 762, 763, respectively and output a bypass airflow signal. However, in embodiments of the invention having CRAC unit redundancy, each hot aisle 761, 762, 763 comprises a flow grid having a plurality of portions which each measure the bypass airflow there-through and provide a bypass airflow signal to control a corresponding one or more CRAC units.

Figure 7A:
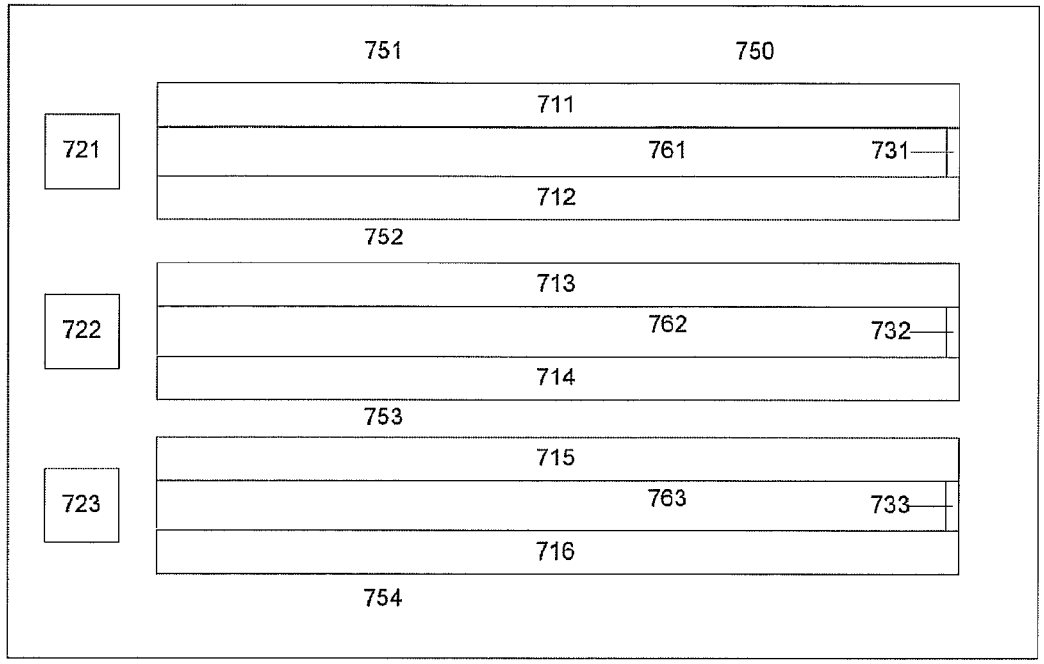
FIG. 7 illustrates a data centre cooling system according to embodiments of the invention which incorporates redundancy between CRAC units.
Figure 7B:
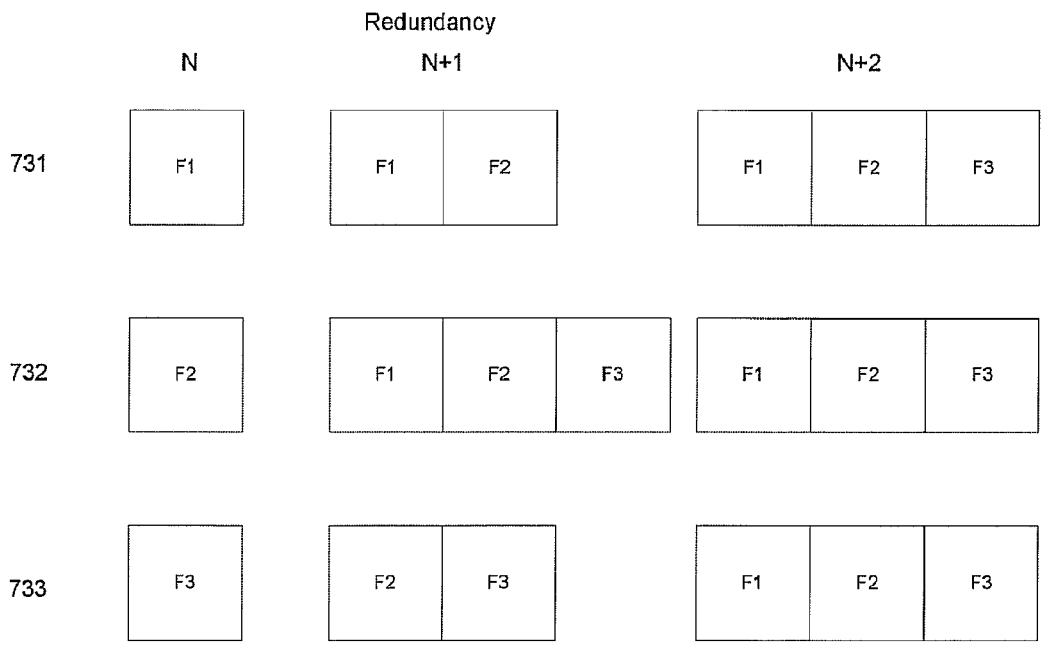

Referring to FIG. 7(a) and the middle column of FIG. 7(b), in one embodiment having N+1 redundancy, the first hot aisle 761 comprises the flow grid 731 divided into two portions which each independently provide a signal indicative of the velocity of the bypass airflow there-through. Alternatively, two separate flow girds may be arranged in the first hot aisle 761. A first portion F1 of the first flow grid 731 measuring bypass airflow into the first hot aisle 761 provides a bypass airflow signal to a control unit (not shown) which is arranged to control the first CRAC unit 721, whilst a second portion F2 of the flow grid 731 provides a bypass airflow signal to the control unit to control the second CRAC unit 722. Similarly, the third flow grid 733 measuring bypass airflow into the third hot aisle 763 is divided into two portions F2, F3. The first portion F2 provides a bypass airflow signal to the control unit to control the second CRAC unit 722, whilst the second portion F3 provides a bypass airflow signal to the control unit to control the third CRAC unit 723. The second flow grid 732 measuring the bypass airflow to the second hot aisle 762 is divided into three portions F1, F2, F3, each providing a signal indicative of the bypass airflow into the second hot aisle 762 to the control unit controlling the first, second and third CRAC units 721, 722, 723, respectively.

In the event that, for example, the second CRAC unit 722 fails or has reduced operation, a reduced velocity of bypass airflow would be measured by the portions F1, F3 of the second flow grid 732 providing a bypass airflow signal indicative of the bypass airflow velocity into the second hot aisle 762 to the control unit. Consequently, the control unit is arranged to increase a flow rate of cooled air into the cold portion 750 from the first and third CRAC units 721, 723 to maintain the predetermined velocity of bypass airflow into the second hot aisle 762. Similarly, if the first CRAC unit 721 fails or has a reduced operation, then the reduced bypass airflow is measured by the portion F2 of the first flow grid 731 providing a bypass airflow signal to control the second CRAC unit 722. In response, the control unit is arranged to control the second CRAC unit 722 to increase a flow rate of cooled air to maintain the predetermined velocity of bypass airflow to the first hot aisle 731.

A further embodiment of the invention will now be described with reference to the right-hand column of FIG. 7(b). In this embodiment having N+2 redundancy each flow grid 731, 732, 733 comprises a portion providing a bypass airflow signal to control each of the CRAC units 721, 722, 723. That is, each flow grid 731, 732, 733 is divided into a number of portions F1, F2, F3 equalling the number of CRAC units 721, 72, 722. Each portion F1, F2, F3 of the flow grids is arranged to provide a bypass airflow signal to the control unit to control a corresponding CRAC unit 721, 722, 723. In the described embodiment, each flow grid 731, 732, 733 is divided into three portions F1, F2, F3, each providing a bypass airflow signal to control a corresponding one of the CRAC units 721, 722, 723, although other numbers of portions and CRAC units may be envisaged. In the event that one or more CRAC units 721, 722, 723 fail or has reduced operation, then a corresponding drop in bypass airflow velocity into one or more hot aisles 761, 762, 763 is measured by the flow gird portions F1, F2, F3 measuring bypass airflow into those hot aisles and the control unit is arranged to respond by increasing a flow rate of cooled air from the remaining CRAC units 721, 722, 723. Thus, failure or reduced operation of one or more CRAC units is compensated for by the remaining CRAC units.

Figure 7C:
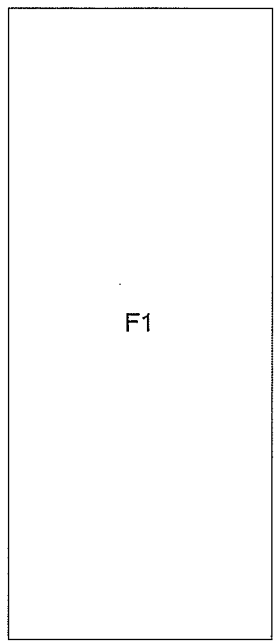
Figure 7C:
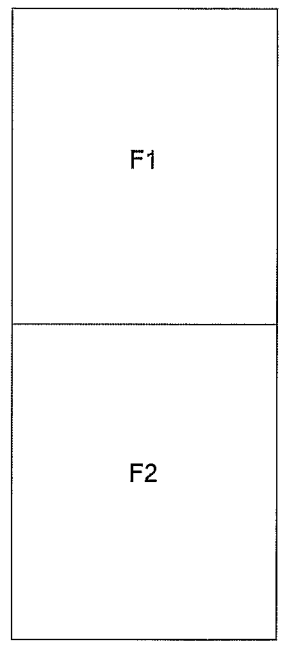
Figure 7C:
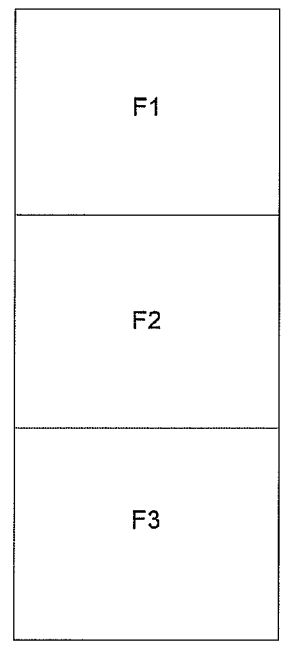

Referring to FIG. 7(c), three configurations of flow grid are shown. The flow grids may form a door or wall of a hot aisle 761, 762, 763. A flow grid 731(a) may be divided into a single portion to provide a single bypass airflow signal. In another embodiment, as shown in FIG. 7(b), the flow grid 731(b) may be horizontally divided into first and second portions F1, F2 to each provide a bypass airflow signal. In another embodiment, the flow grid 731(c) may be divided into first, second and third portions F1, F2, F3, or into a different number of portions corresponding to the number of CRAC units. It will also be realised that other arrangements of flow grid division may be envisaged.

Figure 8A:
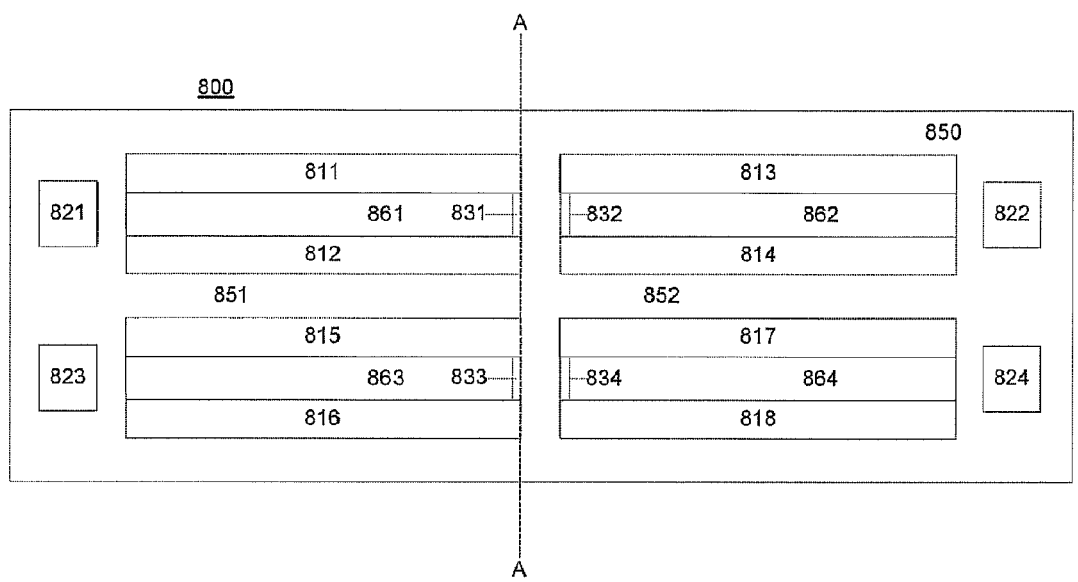
FIG. 8 illustrates a data centre cooling system according to a further embodiment of the invention which incorporate redundancy between CRAC units.

Referring to FIGS. 8(a) and (b) which show a plan view and a cross section through a data centre 800 along a line A-A shown in FIG. 8(a), a further embodiment of the present invention having N+1 (3+1) redundancy and hot aisle containment, as in FIG. 7, is shown.

The data centre 800 comprises a cold portion 850 including cold aisles 851, 852 into which four CRAC units 821, 822, 823, 824 provide cooled air. Four hot aisles 861, 862, 863, 864 are formed between opposing pairs of computing cabinets 811-818. At an end of each hot aisle 861, 862, 863, 864 a flow grid 831, 832, 833, 834 is arranged to measure a bypass airflow into the respective hot aisle 861, 862, 863, 864. Warmed air is expelled from the cabinets 811-818 into a corresponding one of the hot aisles 861, 862, 863, 864 and the warm air is fed to the CRAC units 821, 822, 823, 834 through a hot air plenum or ducting 860.

Figure 8B:
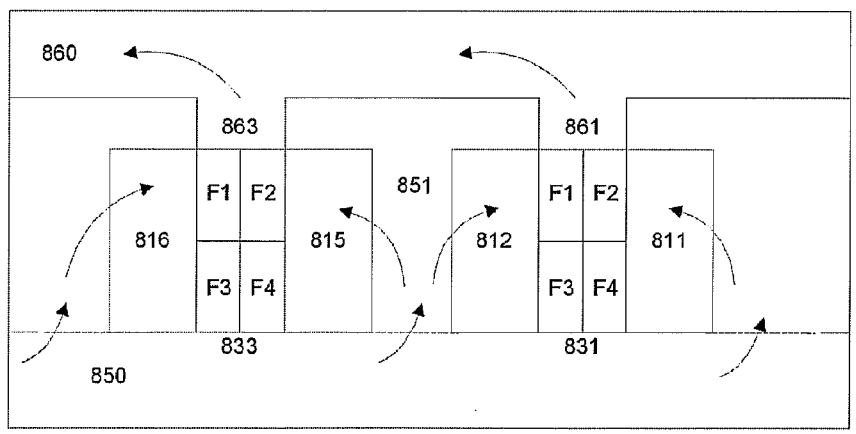

As shown in FIG. 8(b), each flow grid 831, 833 is divided into four portions F1-F4, each corresponding to one of the CRAC units 821-824. Although only two flow grids 831, 833 are shown, the other flow grids 832, 834 have an equivalent division. As described above with reference to FIG. 7, each flow gird portion F1-F4 outputs a bypass airflow signal indicative of the bypass airflow through that portion to a control unit to control a corresponding one of the CRAC units 821-824. In the event that one or more of the CRAC units 821-824 fails or has reduced operation, the control unit is arranged to control the remaining CRAC units to increase a flow rate of cooled air in order to maintain the predetermined level of bypass airflow into each hot aisle 861-864.

Figure 9A:
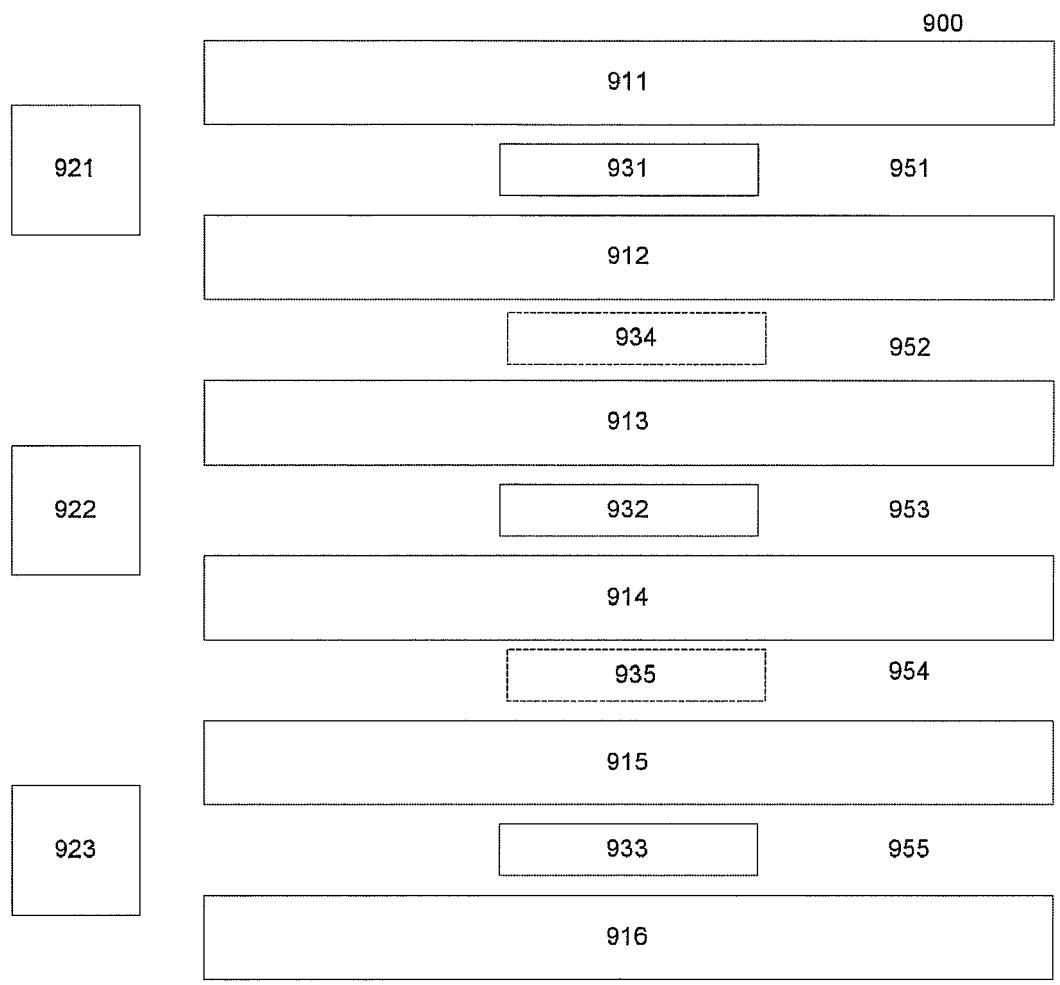
FIG. 9 illustrates a data centre cooling system according to another embodiment of the invention which incorporates redundancy between CRAC units.
Figure 9B:
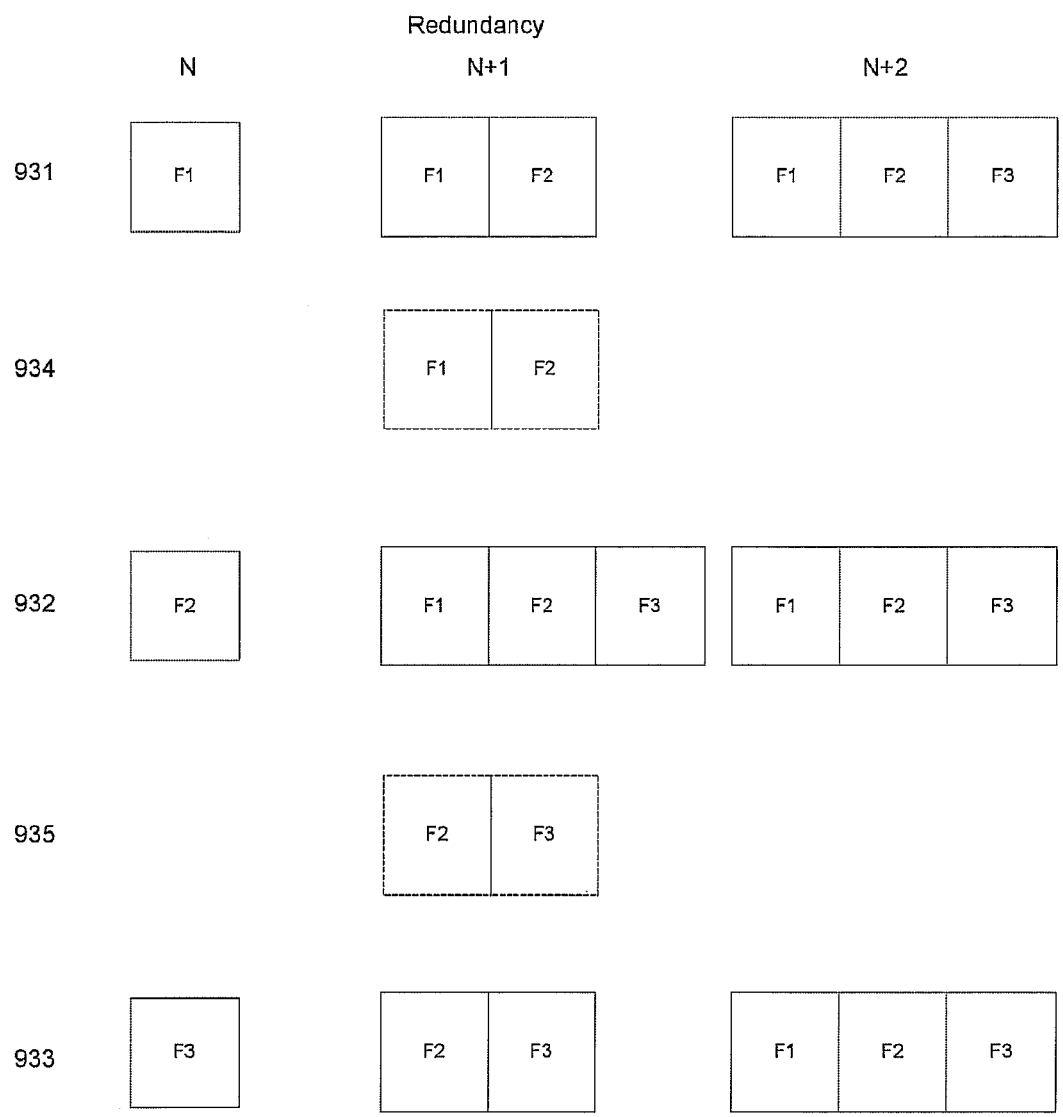

Referring to FIG. 9(a), a layout of a data centre 900 having an exhaust air containment arrangement, similar to FIG. 6, is shown. The data centre 900 comprises a plurality of cold aisles 951-955 interposing rows of cabinets 911, 912, 913, 914, 915, 916. Cooled air is supplied to the cold aisles by three CRAC units 921, 922, 923. Two different arrangements of flow grids are shown. A first arrangement comprises three flow grids 931, 932, 933 arranged in first, third and fifth cold aisles 951, 953, 955. A division of each flow grid is shown in FIG. 9(b). In an arrangement having a redundancy of N (no redundancy), the flow grids 931, 932, 933 are not divided and each output a bypass airflow signal to control a respective CRAC unit 931, 932, 933. A first arrangement of flow grids having N+1 redundancy is shown in a middle column in which the first flow grid 931 is divided into two portions F1, F2 providing bypass airflow signals to control the first and second CRAC units 931, 932 respectively. The second flow grid 932 is divided into three portions F1, F2, F3 providing bypass airflow signals to control the first, second and third CRAC units 931, 932, 933, respectively. The third flow grid 933 is divided into two portions F2, F3 providing bypass airflow signals to control the second and third CRAC units 932, 933 respectively. However, in a second possible arrangement, flow grids 934, 935 are arranged in the second and third cold aisles 952, 954. The first flow grid 934 of the second arrangement is divided into two portions F1, F2 to provide bypass airflow signals to control the first and second CRAC units 921, 922 respectively. The second flow grid 935 of the second arrangement is divided into two portions which provide bypass airflow signals to control the second and third CRAC units 922, 923 respectively. An arrangement of flow grids having N+2 redundancy is shown in the right hand column of FIG. 9(b) and is the same as previously described with reference to FIG. 7.

Figure 10:
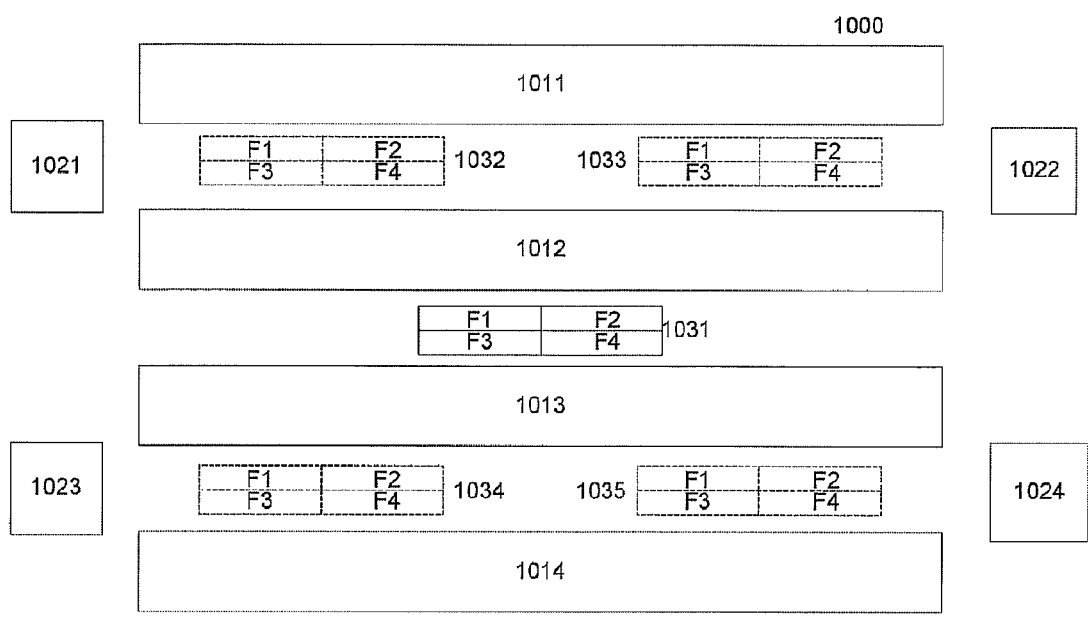
FIG. 10 illustrates a data centre according to a further embodiment of the invention which incorporates redundancy between CRAC units.

FIG. 10 illustrates two further example arrangements of flow grids in a data centre 1000 having exhaust air containment. The data centre 1000 comprises four rows of cabinets 1011, 1012, 1013, 1014 which are supplied with cooled air by four CRAC units 1021, 1022, 1023, 1024. In a first arrangement, a flow grid 1031 which is divided into four portions F1, F2, F3, F4 is centrally arranged in the data centre. Each portion of the flow grid 1031 provides a bypass airflow signal to control a respective one of the CRAC units 1021, 1022, 1023, 1024. The first portion F1 provides a bypass airflow signal to control the first CRAC unit 1021; the second portion F2 provides a bypass airflow signal to control the second CRAC unit 1022; the third portion F3 provides a bypass airflow signal to control the third CRAC unit 1023; and the fourth portion F4 provides a bypass airflow signal to control the fourth CRAC unit 1024. Advantageously, this arrangement minimises a complexity of the CRAC unit control system and requires only a single decoupling area in which the flow grid 1031 is located. However, in another arrangement, four flow grids 1032, 1033, 1034, 1035 are arranged generally toward each corner of the data centre 1000. This arrangement requires more decoupling areas, but provides more responsive control of the CRAC units 1021, 1022, 1023, 1024 since the flow grids 1032, 1033, 1034, 1035 measure bypass airflow in different regions of the data centre 1000. In this arrangement, a control unit controlling each of the CRAC units 1021, 1022, 1023, 1024 receives four bypass airflow signals indicative of the bypass airflow velocity. In the event that one of the four bypass airflow signals drops below the predetermined level, the appropriate control unit is arranged to increase the flow of cooled air from that CRAC unit to the data centre 1000.

Figure 11:
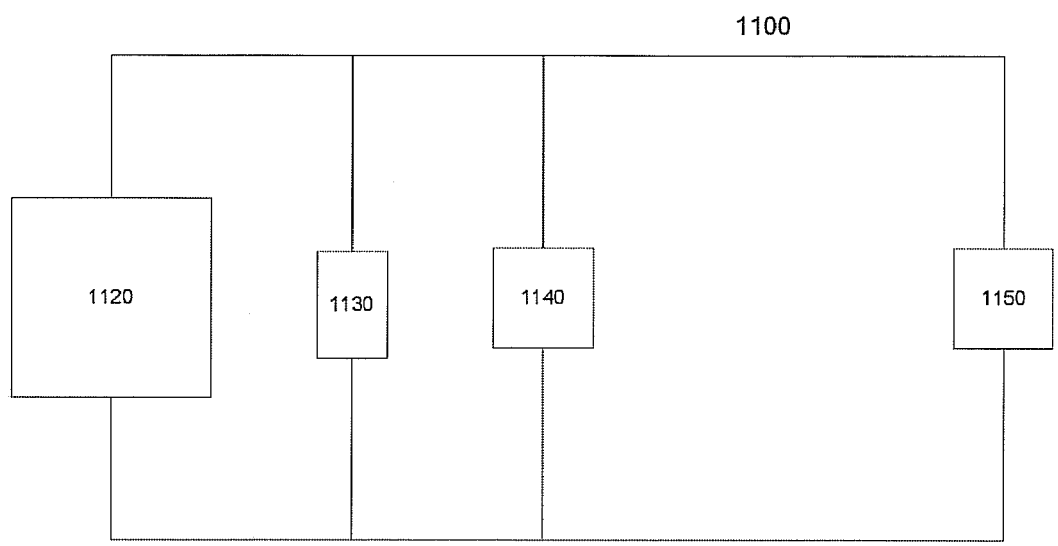
FIG. 11 illustrates design constraints for embodiments of the present invention.

FIG. 11 illustrates design considerations for embodiments of the present invention. FIG. 11 schematically illustrates a data centre 1100 including a CRAC unit 1120, a flow grid 1130, a first server 1140 and a second server 1150. The first server 1140 represents a server that is located in the data centre 1100 near to the flow grid 1130 whilst the second server 1150 represents a server which is located in a region of the data centre distal from flow grid 1130.

The flow grid experiences a constant pressure differential $\Delta P$ between the cold and hot portions of the data centre in which distal ends of the flow grid are located due to maintenance of the bypass airflow at the predetermined level. The first server 1140 also experiences the pressure differential $\Delta P$ between the cold and hot portions at both full and partial operating loads when differing flow rates of air are being drawn through the server 1140 for cooling. It is important to ensure that the differential pressure $\Delta P$ experienced by the first server 1140 is tolerable to a cooling control system of the server 1140. In air supply and return routes between the first server 1140 and the second server 1150 various pressure losses occur, such as in the air supply and return plenums, through air supply floor grilles, in the cabinet in which the sever is located etc. Therefore, the pressure differential experienced by the second server 1150 is less than that of the first server 1140. If the pressure losses between the servers 1140, 1150 exceed the pressure differential $\Delta P$ at the first server 1140, then the second server 1150 may experience a negative pressure between the cold and hot portions of the data centre which would try to draw hot air from the hot portion through the server. Therefore, it should be ensured that the second server 1150 always experiences a positive pressure differential $\Delta P$, even when the operation of one or both of the servers 1140, 1150 is at a minimum load.

Advantageously, embodiments of the present invention provide accurate control of data centre cooling which optimally manages the output of CRAC units in response to a cooling throughput of computing equipment in a data centre. Furthermore, some embodiments of the present invention withstand situations in which one or more CRAC units have reduced operation, such as in a failure case.

Embodiments of the present invention may be static data centres, such as data centres formed by a permanent structure e.g. a building. However, other embodiments of the present invention may be moveable data centres. A moveable data centre may be a containerised data centre wherein computer equipment may be housed within a shipping container type structure. In other embodiments, a moveable data centre may be a wheel-mounted container, such as a wagon or truck trailer. Other moveable data centres may be those mounted on or within a vessel, such as a ship. A moveable data centre may also be known as a portable on-demand data centre.

All of the features disclosed in this specification (including any accompanying claims, abstract and drawings), and/or all of the steps of any method or process so disclosed, may be combined in any combination, except combinations where at least some of such features and/or steps are mutually exclusive.

Each feature disclosed in this specification (including any accompanying claims, abstract and drawings), may be replaced by alternative features serving the same, equivalent or similar purpose, unless expressly stated otherwise. Thus, unless expressly stated otherwise, each feature disclosed is one example only of a generic series of equivalent or similar features.

The invention is not restricted to the details of any foregoing embodiments. The invention extends to any novel one, or any novel combination, of the features disclosed in this specification (including any accompanying claims, abstract and drawings), or to any novel one, or any novel combination, of the steps of any method or process so disclosed. The claims should not be construed to cover merely the foregoing embodiments, but also any embodiments which fall within the scope of the claims.

The invention claimed is:

1. An apparatus for cooling a data centre, comprising:
   an air conditioning unit for supplying cooled air to a cold portion of a data centre;
   said air conditioning unit comprising:
   an airflow measurement device for measuring a rate of bypass airflow through a segregation between the cold portion and hot portion of the data centre, and outputting a bypass airflow signal indicative of the rate of bypass airflow between the cold portion and the hot portion; and
   a control unit arranged to receive the bypass airflow signal from the airflow measurement device and to output a control signal to a means for controlling a rate of the bypass airflow to maintain a predetermined rate of bypass airflow.

2. The apparatus of claim 1, wherein the air conditioning unit is arranged to receive the control signal and to produce cooled air at a rate proportional to a control signal, such that the rate of bypass airflow is controlled in response thereto.

3. The apparatus of claim 2, wherein the control unit is to control a variable rate fan of the air conditioning unit according to the airflow signal.

4. The apparatus of claim 2, comprising a plurality of airflow measurement devices, wherein the control unit is arranged to receive a plurality of airflow signals and to increase the rate of cooled air produced by the air-conditioning unit when one or more of the airflow signals falls below a predetermined level.

5. The apparatus of claim 1 wherein the airflow measuring device is a flow grid.

6. The apparatus of claim 5, wherein the flow grid is arranged to form a wall or a door of the segregation between the cold portion and the hot portion.

7. A data centre segregated into a cold portion and a hot portion, said data centre comprising:
   an air-conditioning unit to supply cooled air to the cold portion of the data centre for cooling computing equipment, said air-conditioning unit comprising:
   an airflow measurement device to measure a rate of bypass airflow through a segregation between the cold portion and the hot portion of the data centre, and output a bypass airflow signal indicative of the rate of bypass airflow between the cold portion and the hot portion; and
   a control unit to receive the bypass airflow signal from the airflow measurement device and to output a control signal to a device to control a rate of the bypass airflow to maintain a predetermined rate of bypass airflow; and
   wherein the airflow measuring device is arranged in an aperture of the segregation between the cold portion and the hot portion to measure the rate of bypass airflow between the cold portion and the hot portion and to output the bypass airflow signal in response to the measured rate of bypass airflow.

8. The data centre of claim 7, wherein the control unit is to control the air-conditioning unit in response to the bypass airflow signal, such that a predetermined level of bypass airflow is maintained between the cold and hot portions.

9. The data centre of claim 7, comprising:
   a plurality of air-conditioning units to supply cooled air to the cold portion of the data centre;
   wherein the control unit is to increase the supply of cooled air from one or more air conditioning units to maintain the predetermined level of bypass airflow when one or more air conditioning units have a reduced operation.

10. The data centre of claim 9, comprising a plurality of airflow measuring devices, wherein each of the plurality of airflow measuring devices is to output a bypass airflow signal, wherein each airflow measuring device is designated as being associated with one or more of the plurality of air conditioning units;

wherein the control unit is to control each of the air-conditioning units based upon the bypass airflow signal received from an airflow measuring device designated as being associated with that air conditioning unit.

11. The data centre of claim 10, wherein the plurality of airflow measuring devices are arranged in a region of the data centre; and the control unit is to maintain the bypass airflow in the region in which the airflow measuring devices are located, even when an air-conditioning unit of one group has a reduced operation, by increasing an airflow rate of air-conditioning units of at least one other group.

12. A method of cooling a data centre which is segregated into a cold portion and a hot portion, said method comprising:

determining a level of bypass airflow between the cold portion and the hot portion of the data centre; and controlling the bypass airflow to maintain a predetermined level of bypass airflow.

13. The method of claim 12, wherein the bypass airflow is controlled by controlling a rate of cooled air supplied to the cold portion in response to the amount of bypass airflow, such that a predetermined amount of bypass airflow is maintained.

14. The method of claim 12, wherein the determining of the level of bypass airflow comprises measuring a velocity of bypass airflow between the cold and hot portions of the data centre.

15. The method of claim 14, wherein cooled air is supplied to the cold portion from a plurality of air conditioning units, the method comprising:

determining the level of bypass airflow at a plurality of locations within the data centre, controlling the supply of cooled air to the cold portion such that when one more of the plurality of air conditioning units have a reduced operation, the rate of cooled air supplied by the remaining air conditioning units is increased to maintain the predetermined amount of bypass airflow.

\* \* \* \* \*

UNITED STATES PATENT AND TRADEMARK OFFICE
CERTIFICATE OF CORRECTION

| | | |
|---|---|---|
| PATENT NO. | : 8,634,963 B2 | Page 1 of 1 |
| APPLICATION NO. | : 13/132866 | |
| DATED | : January 21, 2014 | |
| INVENTOR(S) | : Robert Tozer et al. | |

It is certified that error appears in the above-identified patent and that said Letters Patent is hereby corrected as shown below:

In the Claims

In column 14, line 17, in Claim 15, delete "one" and insert -- one or --, therefor.

Signed and Sealed this
Twentieth Day of May, 2014

Michelle K. Lee
*Deputy Director of the United States Patent and Trademark Office*